(12) United States Patent
Ishida

(10) Patent No.: US 10,954,479 B2
(45) Date of Patent: Mar. 23, 2021

(54) COMPOSITION FOR SURFACE TREATMENT AND SURFACE TREATMENT METHOD USING THE SAME

(71) Applicant: FUJIMI INCORPORATED, Aichi (JP)

(72) Inventor: Yasuto Ishida, Aichi (JP)

(73) Assignee: FUJIMI INCORPORATED

( * ) Notice: Subject to any disclaimer, the term of this patent is extended or adjusted under 35 U.S.C. 154(b) by 34 days.

(21) Appl. No.: 16/320,432

(22) PCT Filed: Jun. 13, 2017

(86) PCT No.: PCT/JP2017/021835
§ 371 (c)(1),
(2) Date: Jan. 24, 2019

(87) PCT Pub. No.: WO2018/020878
PCT Pub. Date: Feb. 1, 2018

(65) Prior Publication Data
US 2019/0241842 A1    Aug. 8, 2019

(30) Foreign Application Priority Data

Jul. 26, 2016 (JP) .............................. JP2016-146627

(51) Int. Cl.
| C11D 7/32 | (2006.01) |
| C11D 7/36 | (2006.01) |
| H01L 21/02 | (2006.01) |
| C11D 3/36 | (2006.01) |
| H01L 21/3105 | (2006.01) |
| C11D 7/34 | (2006.01) |
| C11D 11/00 | (2006.01) |

(52) U.S. Cl.
CPC .................. *C11D 7/36* (2013.01); *C11D 3/36* (2013.01); *C11D 7/34* (2013.01); *C11D 11/0047* (2013.01); *H01L 21/02065* (2013.01); *H01L 21/02074* (2013.01); *H01L 21/31053* (2013.01); *H01L 21/02068* (2013.01)

(58) Field of Classification Search
CPC ................................................. C11D 11/0047
USPC ....................................................... 510/175
See application file for complete search history.

(56) References Cited

U.S. PATENT DOCUMENTS

| 2005/0176606 | A1  | 8/2005  | Konno et al. |
| 2010/0043823 | A1* | 2/2010  | Lee .................. H01L 21/31111 134/1.3 |
| 2010/0105595 | A1* | 4/2010  | Lee ...................... C11D 7/3272 510/176 |
| 2011/0017352 | A1* | 1/2011  | Vandermeulen ........ C23C 22/77 148/241 |
| 2011/0245127 | A1* | 10/2011 | Suzuki .................... C11D 1/008 510/163 |
| 2015/0140820 | A1  | 5/2015  | Kawada et al. |
| 2019/0300821 | A1* | 10/2019 | Yoshizaki ................ C11D 1/34 |

FOREIGN PATENT DOCUMENTS

| JP | 2005-255983 A | 9/2005 |
| TW | 200517487 A | 6/2005 |
| WO | 2013/162020 A1 | 10/2013 |

OTHER PUBLICATIONS

International Search Report for International Application No. PCT/JP2017/021835 dated Sep. 12, 2017.
Office Action for TW Application No. 106121288, dated Dec. 18, 2020.

* cited by examiner

*Primary Examiner* — Gregory E Webb
(74) *Attorney, Agent, or Firm* — Katten Muchin Rosenman LLP

(57) ABSTRACT

The present invention relates to a composition for surface treatment including: a phosphonic acid compound containing two or more nitrogen atoms; and water, wherein the pH is 6 or less, and the composition for surface treatment is used for treating a surface of a polishing-completed object to be polished having a tungsten-containing layer. According to the present invention, there is provided a means capable of inhibiting dissolution of the tungsten-containing layer provided on a polishing-completed object to be polished when a surface treatment is performed.

11 Claims, No Drawings

COMPOSITION FOR SURFACE TREATMENT AND SURFACE TREATMENT METHOD USING THE SAME

TECHNICAL FIELD

The present invention relates to a composition for surface treatment and a surface treatment method using the same.

BACKGROUND ART

In recent years, according to a multilayer wiring on a surface of a semiconductor substrate, a so-called chemical mechanical polishing (CMP) technology of physically polishing and planarizing a semiconductor substrate is used when manufacturing a device. The CMP is a method of planarizing a surface of an object to be polished (object to be subjected to polishing) such as a semiconductor substrate or the like, using a polishing composition (slurry) including abrasive grains such as silica, alumina, ceria, and the like; an anticorrosive agent; a surfactant; or the like. The object to be polished (object to be subjected to polishing) is a wiring, a plug, or the like, formed of silicon, polysilicon, silicon oxide, silicon nitride, a metal, or the like.

A large amount of impurities (foreign materials) remain on the surface of the semiconductor substrate after the CMP process. The impurities include abrasive grains, an organic material such as a metal, an anticorrosive agent, a surfactant, or the like, derived from a polishing composition used in CMP, a silicon-containing material which is an object to be polished, a silicon-containing material or metal made by polishing the metal wiring, the plug, or the like, and an organic material such as a pad debris made from various pads or the like.

If the surface of the semiconductor substrate is contaminated by these impurities, there is a possibility that electrical characteristics of the semiconductor are adversely affected, which results in deterioration of reliability of the device. Therefore, it is desirable to introduce a cleaning process after the CMP process to remove these impurities from the surface of the semiconductor substrate.

As a cleaning agent (cleaning composition) used in the cleaning process, for example, a cleaning composition for a semiconductor substrate containing a phosphonic acid-based chelate agent, specific monoamine, and water and having a pH of more than 6 and less than 7 has been proposed in WO 2013/162020 A (corresponding to US Patent Application Publication No. 2015/140820 A). In addition, WO 2013/162020 A (corresponding to the specification of US Patent Application Publication No. 2015/140820 A) discloses that the cleaning composition is capable of removing foreign materials (abrasive fine grains) without corroding the substrate surface (tungsten wiring or tungsten alloy wiring).

SUMMARY OF INVENTION

However, as a result of review by the present inventors, it was newly found that when the above-described cleaning agent disclosed in WO 2013/162020 A (corresponding to the specification of US Patent Application Publication No. 2015/140820 A) was used to clean a polishing-completed object to be polished having a tungsten-containing layer (tungsten layer) on a surface thereof, there was a problem that an effect of inhibiting corrosion (dissolution) of the tungsten layer was not sufficient.

The present invention has been made in view of the above-described problems, and an object of the present invention is to provide a means capable of inhibiting dissolution of a tungsten-containing layer provided on a polishing-completed object to be polished when a surface treatment is performed.

In consideration of the above-described problems, the present inventors conducted intensive studies. As a result, the present inventors found that the above-described problems can be solved by using a composition for surface treatment including: a specific phosphonic acid compound; and water, and having a pH within a specific range, and completed the present invention.

That is, the above problems of the present invention are solved by a composition for surface treatment including: a phosphonic acid compound containing two or more nitrogen atoms; and water, wherein the pH is 6 or less, and the composition for surface treatment is used for treating a surface of a polishing-completed object to be polished having a tungsten-containing layer.

DESCRIPTION OF EMBODIMENTS

A composition for surface treatment according to an embodiment of the present invention is used for treating a surface of a polishing-completed object to be polished having a tungsten-containing layer. In addition, in the present specification, "surface treatment" is a concept including, for example, a cleaning treatment and a rinse polishing treatment for a polishing-completed object to be polished as described in detail below. Therefore, the composition for surface treatment according to an embodiment of the present invention is used as a cleaning composition or a rinse polishing composition.

In addition, in the present specification, the term "tungsten-containing layer" is simply referred to as "tungsten layer" or "W layer", the term "polishing-completed object to be polished having a tungsten-containing layer" is simply referred to as "polishing-completed object to be polished", and the term "composition for surface treatment according to an embodiment of the present invention" may also be simply referred to as "composition for surface treatment".

The cleaning process performed after a chemical mechanical polishing (CMP) process is performed for the purpose of removing impurities (foreign materials such as particles, metal contamination, organic residue, pad debris, and the like) remaining in the surface of the semiconductor substrate (polishing-completed object to be polished). Here, these foreign materials can be removed by cleaning with the cleaning agent disclosed in, for example, WO 2013/162020 A (corresponding to US No. 2015/140820 A). However, the present inventors found that when the polishing-completed object to be polished having the tungsten layer was cleaned using this cleaning agent, an effect of inhibiting dissolution of the tungsten layer was not sufficient. Further, as a result of intensive studies, it was found that when a surface treatment was performed with a composition for surface treatment according to an embodiment of the present invention, dissolution of the tungsten layer provided on the surface of the polishing-completed object to be polished was effectively inhibited.

The composition for surface treatment according to an embodiment of the present invention includes a phosphonic acid compound containing two or more nitrogen atoms; and water, wherein the pH is 6 or less.

The present inventors presume the mechanism in which the above-described problem is solved by the present invention as follows.

It is thought that the tungsten layer is easily dissolved since the tungsten layer formed on the surface of the polishing-completed object to be polished forms a hydrate ($W_XO_Y^{A-}$) with water included in the cleaning agent (composition used for cleaning). The dissolution of the tungsten layer becomes more significant when the pH is high (that is, when it is alkaline) or when the potential of the polishing-completed object to be polished is high.

On the other hand, it is thought that since the composition for surface treatment of the present invention includes a phosphonic acid compound containing two or more nitrogen atoms, the corresponding phosphonic acid compound is adsorbed to the tungsten layer, thereby protecting the surface of the corresponding layer. Specifically, the phosphonic acid compound according to the present invention includes two or more nitrogen atoms and is coordinated to the surface of the tungsten layer by the corresponding nitrogen atom. Further, stable coordination of these nitrogen atoms induces formation of an insoluble complex on the surface of the tungsten layer together with a phosphonic acid group (—P(O)(OH)$_2$), and as a result, it is presumed that hydration is inhibited, and the phosphonic acid compound functions as an inhibitor (dissolution inhibitor) that inhibits dissolution of the tungsten layer.

Further, it is considered that since the pH of the composition for surface treatment of the present invention is 6 or less (acidic), dissolution of the tungsten layer, which becomes remarkable when the pH is high, can be inhibited. Therefore, according to the present invention, there is provided a means capable of inhibiting the dissolution of the tungsten-containing layer provided on the polishing-completed object to be polished when the surface treatment is performed.

As described above, dissolution of the tungsten layer can be inhibited by using the composition for surface treatment of the present invention. Further, the above mechanism is based on speculation, and this mechanism being correct or incorrect does not affect the technical scope of the present invention.

Hereinafter, the present invention is described. In addition, the present invention is not limited to exemplary embodiments below. In addition, unless specifically stated otherwise used herein, operation and measurement of physical properties, and the like, are performed under conditions of room temperature (20 to 25° C.)/relative humidity of 40 to 50% RH.

<Composition for Surface Treatment>

Hereinafter, each component included in the composition for surface treatment is described.

[Phosphonic Acid Compound Containing Two or More Nitrogen Atoms]

The composition for surface treatment according to an embodiment of the present invention includes a phosphonic acid compound containing two or more nitrogen atoms (also referred to simply as "phosphonic acid compound" in the present specification). The corresponding phosphonic acid compound contributes to inhibition of dissolution of the tungsten layer, as described above. In other words, the phosphonic acid compound according to the present invention functions as a dissolution inhibitor (hereinafter, sometimes referred to simply as "inhibitor" or "suppressor") for inhibiting dissolution of the tungsten layer or the like.

Further, the phosphonic acid compound can also contribute to suppression of an increase in surface roughness (increase in the average surface roughness Ra value) of the polishing-completed object to be polished (specifically, the tungsten layer) when the surface treatment is performed. It is considered that the increase in surface roughness of the tungsten layer is caused by grain boundary corrosion. On the other hand, as described above, the effect of the phosphonic acid compound as an inhibitor induces the inhibition of the dissolution of the tungsten layer, thereby resulting in inhibition of dissolution in the grain boundary of the tungsten layer. As a result, it is considered that smoothness of the surface of the tungsten layer is maintained satisfactorily.

The phosphonic acid compound is not particularly limited as long as it is a compound having two or more nitrogen atoms and one or more phosphonic acid groups (—P(O)(OH)$_2$). In addition, in the composition for surface treatment, the phosphonic acid group may be included in a state of a phosphonic acid base (—P(O) (OM$^1$)$_2$ or —P(O)(OM$^1$)(OH); wherein M$^1$ is an organic or inorganic cation).

The number of nitrogen atoms of the phosphonic acid compound according to the present invention is 2 or more. As the number of nitrogen atoms becomes larger, it is preferred since the phosphonic acid compound is easily coordinated to the tungsten layer, the dissolution of the tungsten layer or the like is inhibited. Meanwhile, the upper limit of the number of nitrogen atoms is not particularly limited, but it is preferably 8 or less from the viewpoint that the phosphonic acid compound itself can be easily removed from the tungsten layer after the surface treatment. In addition, from the viewpoint of balance between inhibition of dissolution of the tungsten layer or the like, and easiness of removal of the phosphonic acid compound after the surface treatment, the number of nitrogen atoms is preferably 2 or more and 6 or less, more preferably 2 or more and 4 or less, and particularly preferably 2 or 3.

The number of phosphonic acid groups of the phosphonic acid compound according to the present invention is not particularly limited as long as it is 1 or more, from the viewpoint of balance between inhibition of dissolution of the tungsten layer or the like, and easiness of removal of the phosphonic acid compound after the surface treatment, the number of phosphonic acid groups is preferably 1 or more and 10 or less, and more preferably 2 or more and 6 or less.

In particular, the phosphonic acid compound included in the composition for surface treatment is preferably a compound represented by Formula (1) or a salt thereof:

[Chemical Formula 1]

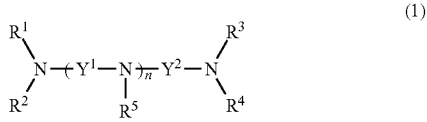

(1)

in Formula (1), Y$^1$ and Y$^2$ each independently represent a linear or branched alkylene group having 1 or more and 5 or less carbon atoms, n is an integer of 0 or more and 4 or less, and R$^1$ to R$^5$ each independently represent a hydrogen atom, a substituted or unsubstituted linear or branched alkyl group having 1 or more and 5 or less carbon atoms, wherein at least one of R$^1$ to R$^5$ is an alkyl group substituted with a phosphonic acid group.

In Formula (1) above, the linear or branched alkylene group having 1 or more and 5 or less carbon atoms as Y$^1$ and Y$^2$ is not particularly limited, and examples thereof may include linear or branched alkylene groups such as a methylene group, an ethylene group, a trimethylene group, a tetramethylene group, a propylene group, and the like.

Among them, a linear or branched alkylene group having 1 or more and 4 or less carbon atoms is preferable, and a linear or branched alkylene group having 1 or more and 3 or less carbon atoms is more preferable. Further, from the viewpoint of inhibiting the dissolution of tungsten or the like, and from the viewpoint of availability, the alkylene group having 1 or 2 carbon atoms, i.e., a methylene group or an ethylene group is more preferable, and the ethylene group is particularly preferable.

In Formula (1), n represents the number of moieties represented by ($-Y^1-N(R^5)-$) and is an integer of 0 or more and 4 or less. From the viewpoint of improvement of the effect of inhibiting dissolution of tungsten or the like, and from the viewpoint of availability, n is preferably an integer of 0 or more and 2 or less, and particularly preferably 0 or 1. In addition, when n is 2 or more, the n moieties represented by ($-Y^1-N(R^5)-$) may be the same as or different from each other.

In Formula (1), the substituted or unsubstituted linear or branched alkyl group having 1 or more and 5 or less carbon atoms as $R^1$ to $R^5$ is not particularly limited, and examples thereof may include alkyl groups such as a methyl group, an ethyl group, a propyl group, an isopropyl group, a butyl group, an isobutyl group, a sec-butyl group, a tert-butyl group, and the like. Among them, a linear or branched alkyl group having 1 or more and 4 or less carbon atoms is preferable, and a linear or branched alkyl group having 1 or more and 3 or less carbon atoms is more preferable. In addition, from the viewpoint of improvement of the effect of inhibiting dissolution of tungsten or the like, and from the viewpoint of availability, the methyl group and the ethyl group are more preferable, and the methyl group is particularly preferable.

Here, the "substituted or unsubstituted" with respect to the alkyl group means that one or more hydrogen atoms of the alkyl group may be substituted with another substituent or may not be substituted. Here, the substitutable substituent is not particularly limited. For example, examples of the substitutable substituent may include substituents such as a fluorine atom (F); a chlorine atom (Cl); a bromine atom (Br); an iodine atom (I); a phosphonic acid group ($-PO_3H_2$); a phosphoric acid group ($-OPO_3H_2$); a sulfonic acid group ($-SO_3H$); a thiol group ($-SH$); a cyano group ($-CN$); a nitro group ($-NO_2$); a hydroxy group ($-OH$); a linear or branched alkoxy group having 1 or more and 10 or less carbon atoms (e.g., a methoxy group, an ethoxy group, a propoxy group, an isopropoxy group, a butoxy group, a pentyloxy group, a hexyloxy group, a 2-ethylhexyloxy group, an octyloxy group, a dodecyloxy group or the like); an aryl group having 6 or more and 30 or less carbon atoms (e.g., a phenyl group, a biphenyl group, a 1-naphthyl group, or a 2-naphthyl group); a cycloalkyl group having 3 or more and 20 or less carbon atoms (e.g., a cyclopropyl group, a cyclobutyl group, a cyclopentyl group, a cyclohexyl group, or a cycloheptyl group), and the like.

In Formula (1), at least one of $R^1$ to $R^5$ is an alkyl group substituted with a phosphonic acid group (a linear or branched alkyl group having 1 or more and 5 or less carbon atoms and being substituted with a phosphonic acid group).

The "alkyl group substituted with a phosphonic acid group" is a linear or branched alkyl group having 1 or more and 5 or less carbon atoms and being substituted with one or more phosphonic acid groups, and examples thereof may include a (mono)phosphonomethyl group, a (mono)phosphonoethyl group, a (mono)phosphono-n-propyl group, a (mono)phosphonoisopropyl group, a (mono)phosphono-n-butyl group, a (mono)phosphonoisobutyl group, a (mono)phosphono-s-butyl group, a (mono)phosphono-t-butyl group, a diphosphonomethyl group, a diphosphonoethyl group, a diphosphono-n-propyl group, a diphosphonoisopropyl group, a diphosphono-n-butyl group, a diphosphonoisobutyl group, a diphosphono-s-butyl group, a diphosphono-t-butyl group, and the like. Among them, a linear or branched alkyl group having 1 or more and 4 or less carbon atoms and being substituted with one phosphonic acid group is preferable, and a linear or branched alkyl group having 1 or more and 3 or less carbon atoms and being substituted with one phosphonic acid group is more preferable. In addition, from the viewpoint of improvement of the effect of inhibiting dissolution of tungsten, or the like, and from the viewpoint of availability, the (mono)phosphonomethyl group, the (mono)phosphonoethyl group are more preferable, and the (mono)phosphonomethyl group is particularly preferable.

In Formula (1), it is more preferable that at least four of $R^1$ to $R^5$ are alkyl groups substituted with a phosphonic acid group. In addition, from the viewpoint of the effect of inhibiting the dissolution of tungsten, and the like, it is preferable that all of $R^1$ to $R^4$ are linear or branched alkyl groups having 1 or more and 5 or less carbon atoms and being substituted with a phosphonic acid group, and it is particularly preferable that all of $R^1$ to $R^4$ and n $R^5$ are linear or branched alkyl groups having 1 or more and 5 or less carbon atoms and being substituted with a phosphonic acid group.

In the composition for surface treatment according to an embodiment of the present invention, examples of the compounds that are particularly and preferably used may include ethylenediamine tetraethylenephosphonic acid, ethylenediamine tetramethylenephosphonic acid (ethylenediamine tetra (methylenephosphonic acid)), diethylenetriamine pentaethylenephosphonic acid, diethylenetriamine pentamethylenephosphonic acid (diethylenetriaminepenta(methylenephosphonic acid)), triethylenetetramine hexaethylenephosphonic acid, triethylenetetramine hexamethylenephosphonic acid, propanediamine tetraethylenephosphonic acid, and propanediamine tetramethylenephosphonic acid, and ammonium salts, potassium salts, sodium salts, and lithium salts of these acids. That is, the phosphonic acid compound according to the present invention preferably includes at least one selected from the group consisting of the phosphonic acid compounds and salts thereof.

In particular, in consideration of the effect of inhibiting the dissolution of the tungsten layer, availability, or the like, it is more preferable that the phosphonic acid compound includes at least one selected from the group consisting of ethylenediamine tetraethylenephosphonic acid, ethylenediamine tetramethylenephosphonic acid, diethylenetriamine pentaethylenephosphonic acid, and diethylenetriamine pentamethylenephosphonic acid, and ammonium salts, potassium salts, sodium salts, and lithium salts of these acids, and further, it is particularly preferable that the phosphonic acid compound includes at least one selected from the group consisting of ethylenediamine tetramethylenephosphonic acid and diethylenetriamine pentamethylenephosphonic acid, and ammonium salts, potassium salts, sodium salts, and lithium salts of these acids.

In addition, these phosphonic acid compounds may be used alone or in combination of two or more kinds thereof.

The content of the phosphonic acid compound is not particularly limited, but the content of the phosphonic acid compound is preferably 0.01% by mass or more with respect to the total mass of the composition for surface treatment. When the content of the phosphonic acid compound is 0.01% by mass or more, the effect of inhibiting the dissolution of the tungsten layer or the like is improved.

From the same viewpoint, the content of the phosphonic acid compound is preferably 0.02% by mass or more, more preferably 0.05% by mass or more, further preferably 0.06% by mass or more, and particularly preferably 0.08% by mass or more, with respect to the total mass of the composition for surface treatment. In addition, the content of the phosphonic acid compound is preferably 5% by mass or less with respect to the total mass of the composition for surface treatment. When the content of the phosphonic acid compound is 5% by mass or less, the removal of the phosphonic acid compound itself after the surface treatment is facilitated. From the same viewpoint, the content of the phosphonic acid compound is more preferably 3% by mass or less, more preferably 1% by mass or less, and particularly preferably less than 1% by mass, with respect to the total mass of the composition for surface treatment.

In addition, when the composition for surface treatment further includes a polymer compound having a sulfonic acid (salt) group (simply referred to as "sulfonic acid group-containing polymer" in this specification), a mass ratio of the phosphonic acid compound to the corresponding sulfonic acid group-containing polymer is preferably 0.1 or more. When the corresponding mass ratio is 0.1 or more, the effect of inhibiting dissolution of the tungsten layer, or the like, can be sufficiently obtained. Further, from the viewpoint of improvement of the effect of inhibiting dissolution of the tungsten layer, or the like, the mass ratio is more preferably 0.2 or more, and further preferably 0.4 or more.

Further, it is preferable that the phosphonic acid compound is included in the composition for surface treatment in a larger amount than the polymer compound having the sulfonic acid (salt) group included. In other words, it is preferable when the mass ratio of the phosphonic acid compound to the corresponding sulfonic acid group-containing polymer exceeds 1 (i.e., the polymer compound having the sulfonic acid (salt) group:phosphonic acid compound (mass ratio)=1:more than 1). When the mass ratio exceeds 1, an effect of inhibiting not only the dissolution of the tungsten layer but also an increase of the surface roughness is further improved. It is thought that the reason is because the phosphonic acid compound is included in a large amount, which facilitates formation of a complex between the phosphonic acid compound and the tungsten layer, thereby inhibiting hydration of the tungsten layer.

From the same viewpoint, the mass ratio of the phosphonic acid compound (the phosphonic acid compound/the polymer compound having the sulfonic acid (salt) group) to the polymer compound having the sulfonic acid (salt) group is more preferably 1.2 or more and particularly preferably 1.5 or more. The upper limit of the corresponding mass ratio is not particularly limited, but is preferably 10 or less, and more preferably 5 or less in consideration of the easiness of removal of the phosphonic acid compound itself after the surface treatment.

The phosphonic acid compound preferably has a molecular weight of less than 1,000. When the molecular weight is less than 1,000, it is preferable since it is easy to remove the phosphonic acid compound in a process of removing the phosphonic acid compound after the surface treatment of the polishing-completed object to be polished. From the same viewpoint, a molecular weight of the phosphonic acid compound is more preferably 800 or less, and particularly preferably 600 or less. Meanwhile, the lower limit value of the molecular weight of the phosphonic acid compound is not particularly limited, but preferably 120 or more. In addition, the molecular weight of the phosphonic acid compound can be measured by mass spectroscopy (MS) such as gas chromatography-mass spectrometry (GC-MS), HPLC-tandem quadrupole mass spectrometry, high performance liquid chromatography (HPLC), and the like.

[pH]

The pH of the composition for surface treatment according to an embodiment of the present invention is 6 or less. When the pH is 6 or less, the formation of tungsten hydrate is inhibited, and thus the dissolution of the tungsten layer can be further suppressed. On the contrary, when the pH exceeds 6, it is easy to form a tungsten hydrate, and thus the tungsten layer is dissolved. Further, from the viewpoint of further inhibiting the dissolution of the tungsten layer, the pH is more preferably 4 or less, further preferably less than 4, still more preferably 3 or less, particularly preferably less than 3, and the most preferably 2.5 or less. In addition, the pH is preferably 1 or more. When the pH is 1 or more, it is preferable from the viewpoint of cost reduction since an addition amount of the acid for adjusting the pH to be low can be reduced.

Further, as described in detail below, by setting the pH of the composition for surface treatment to be 6 or less (i.e., adjusting a liquid property to be acidic), the surface of the polishing-completed object to be polished or the surface of the foreign material can be positively charged, thereby obtaining an effect of removing the foreign material sufficiently by electrostatic repulsion.

In addition, the pH of the composition for surface treatment can be confirmed by a pH meter (Product name: LAQUA® manufactured by HORIBA, Ltd.).

When adjusting the pH, components other than essential components of the composition for surface treatment according to an embodiment of the present invention may cause foreign materials, and thus it is preferable that the components are not added as much as possible. Therefore, it is preferable that the composition for surface treatment is prepared only by including the phosphonic acid compound, water, and the polymer compound having the sulfonic acid (salt) group added as needed, or acid described above. However, when it is difficult to obtain a desired pH by these components only, other additives such as alkali that can be arbitrarily added, and the like, may be used to adjust the pH to be within the range in which the effects of the present invention are not impaired.

[Dispersing Medium]

The composition for surface treatment according to an embodiment of the present invention includes a dispersing medium (solvent). The dispersing medium has a function of dispersing or dissolving each component. The dispersing medium is not limited to time as long as it contains water, and may be water alone. Further, the dispersing medium may be a mixed solvent of water and an organic solvent for dispersing or dissolving each component. In this case, examples of the organic solvent to be used may include acetone, acetonitrile, ethanol, methanol, isopropanol, glycerin, ethylene glycol, propylene glycol, and the like, which are organic solvents mixed with water. Further, these organic solvents may be used without being mixed with water, and after dispersing or dissolving each component, the organic solvents may be mixed with water. These organic solvents may be used alone or in combination of two or more kinds thereof. Among them, the dispersing medium is preferably only water.

Water is preferably water which does not contain impurities as much as possible from the viewpoint of hindering contamination of the object to be cleaned and action of other components. For example, water having a total content of transition metal ions of 100 mass ppb or less is preferable. Here, purity of water can be increased by operations such as removal of impurity ions using an ion exchange resin, removal of foreign materials by a filter, distillation, and the like. Specifically, it is preferable to use deionized water (ion exchange water), pure water, ultrapure water, distilled water, or the like, as the water.

[Polymer Compound Having Sulfonic Acid (Salt) Group]

The composition for surface treatment according to an embodiment of the present invention preferably further includes a polymer compound having a sulfonic acid (salt) group. The polymer compound having the sulfonic acid (salt) group (also referred to simply as "sulfonic acid group-containing polymer" in this specification) contributes to the removal of foreign materials in the composition for surface treatment. Therefore, the composition for surface treatment containing the sulfonic acid group-containing polymer can sufficiently remove the foreign materials remaining in the surface of the polishing-completed object to be polished (impurities including organic residues, and the like) in the surface treatment (cleaning, or the like) of the polishing-completed object to be polished.

The corresponding sulfonic acid group-containing polymer can form micelles by affinity of a portion other than a sulfonic acid (salt) group (i.e., a polymer chain portion of a sulfonic acid group-containing polymer) and foreign materials (particularly, a hydrophobic component). Therefore, it is thought that the micelles are dissolved or dispersed in the composition for surface treatment, thereby effectively removing the foreign materials which are the hydrophobic components.

Further, under acidic conditions, when the surface of the polishing-completed object to be polished is cationic, the sulfonic acid group becomes anionized, which is likely to be adsorbed on the surface of the corresponding polishing-completed object to be polished. As a result, it is considered that the surface of the polishing-completed object to be polished is covered with the above-described sulfonic acid group-containing polymer. Meanwhile, since the remaining foreign materials (particularly materials that are likely to have a cationic property) are likely to adsorb the sulfonic acid groups of the sulfonic acid group-containing polymer, the surface of the foreign materials becomes anionic. Therefore, the foreign material of which the surface becomes anionic and the anionized sulfonic acid group of the sulfonic acid group-containing polymer adsorbed on the surface of the polishing-completed object to be polished form electrostatic repulsion. Further, when the foreign materials are anionic, the foreign materials themselves and the anionic sulfonic acid group present on the polishing-completed object to be polished form electrostatic repulsion. Therefore, it is considered that the foreign materials can be effectively removed by using the electrostatic repulsion.

Further, when it is difficult for the polishing-completed object to be polished to have a charge, it is presumed that the foreign materials are removed by a mechanism different from the above. First, it is thought that the foreign materials (particularly, the hydrophobic component) are likely to be adhered to the polishing-completed object to be polished, which is hydrophobic, by hydrophobic interaction. Here, the polymer chain portion (hydrophobic structural portion) of the sulfonic acid group-containing polymer faces a surface side of the polishing-completed object to be polished due to hydrophobicity thereof, whereas the anionized sulfonic acid group, or the like, which is a hydrophilic structural portion, faces a side opposite to the surface side of the polishing-completed object to be polished. As a result, it is presumed that the surface of the polishing-completed object to be polished is covered with the anionized sulfonic acid group, thereby resulting in hydrophilicity. As a result, it is thought that it is difficult to form hydrophobic interaction between the foreign materials (particularly, the hydrophobic component) and the polishing-completed object to be polished, and thus adhesion of the foreign materials is inhibited.

The phosphonic acid compound and the sulfonic acid group-containing polymer adsorbed on the surface of the polishing-completed object to be polished are easily removed by further washing with water or the like.

In addition, in the present specification, the term "sulfonic acid (salt) group" refers to a sulfonic acid group ($—SO_3H$) or a sulfonic acid salt group ($—SO_3M^2$; wherein $M^2$ is an organic or inorganic cation).

The sulfonic acid group-containing polymer is not particularly limited as long as it has a sulfonic acid (salt) group, and known compounds can be used. Examples of the sulfonic acid group-containing polymer may include a polymer compound obtained by sulfonating a polymer compound serving as a base, a polymer compound obtained by (co)polymerizing a monomer having a sulfonic acid (salt) group, and the like.

More specifically, examples of the sulfonic acid group-containing polymer may include sulfonic acid (salt) group-containing polyvinyl alcohol (sulfonic acid-modified polyvinyl alcohol), sulfonic acid (salt) group-containing polystyrene such as sodium polystyrene sulfonate, or the like, sulfonic acid (salt) group-containing polyvinyl acetate (sulfonic acid-modified polyvinyl acetate), sulfonic acid (salt) group-containing polyester, a copolymer of (meth)acrylic group-containing monomer-sulfonic acid (salt) group-containing monomer such as a copolymer of a (meth)acrylic acid-sulfonic acid (salt) group-containing monomer, and the like. In addition, in the present specification, the notation "(meth)acrylic" in the specific name of the compound represents "acrylic" and "methacrylic", and the notation "(meth)acrylate" represents "acrylate" and "methacrylate". The sulfonic acid group-containing polymer may be used alone or in combination of two or more kinds thereof. At least some of the sulfonic acid groups included in these polymers may be in salt form. Examples of the salt may include alkali metal salts such as sodium salts, potassium salts, and the like, salts of Group 2 elements such as calcium salts, magnesium salts, and the like, amine salts, ammonium salts, and the like. Particularly, when the polishing-completed object to be polished is a semiconductor substrate after the CMP process, the salt is preferably an ammonium salt from the viewpoint of removing the metal on the surface of the substrate as much as possible.

That is, the polymer compound having the sulfonic acid (salt) group according to the present invention preferably includes at least one selected from the group consisting of sulfonic acid group-containing polyvinyl alcohol, sulfonic acid group-containing polystyrene, sulfonic acid group-containing polyvinyl acetate, sulfonic acid group-containing polyester, and the copolymer of (meth)acrylic group-containing monomer-sulfonic acid group-containing monomer, and sodium salts, potassium salts, calcium salts, magnesium salts, amine salts, and ammonium salts thereof. Further, it is more preferable that the polymer compound having the sulfonic acid (salt) group according to the present invention includes at least one selected from the group consisting of sodium salts, potassium salts, calcium salts, magnesium salts, amine salts, and ammonium salts of the sulfonic acid group-containing polystyrene.

In addition, from the viewpoint that the effect of inhibiting the dissolution of the tungsten-containing layer is high, it is particularly preferable that the composition for surface treatment according to an embodiment of the present invention includes at least one selected from the group consisting of ethylenediamine tetraethylenephosphonic acid, ethylenediamine tetramethylenephosphonic acid, diethylenetriamine pentaethylenephosphonic acid, diethylenetriamine pentamethylenephosphonic acid, triethylenetetramine hexaethylenephosphonic acid, triethylenetetramine hexamethylenephosphonic acid, propanediamine tetraethylenephosphonic acid, and propanediamine tetramethylenephosphonic acid, and ammonium salts, potassium salts, sodium salts, and lithium salts of these acids; and at least one selected from the group consisting of sodium salts, potassium salts, calcium salts, magnesium salts, amine salts, and ammonium salts of the sulfonic acid group-containing polystyrene.

In addition, when the sulfonic acid group-containing polymer is sulfonic acid group-containing polyvinyl alcohol, the degree of saponification is preferably 80% or more, and more preferably 85% or more (upper limit is 100%) from the viewpoint of solubility.

In the present invention, the sulfonic acid group-containing polymer preferably has a weight average molecular weight of 1,000 or more. When the weight average molecular weight is 1,000 or more, the effect of removing foreign materials is further enhanced. It is presumed that the reason is because an action of removing the foreign materials from the surface of the object to be cleaned or an action of inhibiting reattachment of the organic materials to the surface of the polishing-completed object to be polished is further improved due to better coverage when the polishing-completed object to be polished or the foreign materials are covered. From the same viewpoint, the weight average molecular weight is more preferably 2,000 or more, and further preferably 8,000 or more.

Further, the weight average molecular weight of the sulfonic acid group-containing polymer is preferably 100,000 or less. When the weight average molecular weight is 100,000 or less, the effect of removing foreign materials is further enhanced. This is presumably because of better removability of the sulfonic acid group-containing polymer after the cleaning process. From the same viewpoint, the weight average molecular weight of the sulfonic acid group-containing polymer is more preferably 50,000 or less, and further preferably 40,000 or less.

The weight average molecular weight can be measured by gel permeation chromatography (GPC). Details of a method of measuring the weight average molecular weight are described in Examples.

As the sulfonic acid group-containing polymer, a commercially available product may be used. For example, GOHSENX® L-3226 and GOHSENX® CKS-50 manufactured by The Nippon Synthetic Chemical Industry Co., Ltd., Aron® A-6012, A-6016A, and A-6020 manufactured by Toagosei Company, Limited., Poly NaSS® PS-1 manufactured by Tosoh Organic Chemical Co., Ltd., and the like can be used.

The content of the sulfonic acid group-containing polymer is preferably 0.01% by mass or more with respect to the total mass of the composition for surface treatment. When the content of the sulfonic acid group-containing polymer is 0.01% by mass or more, the effect of removing foreign materials is further improved. It is presumed that the reason is because when the sulfonic acid group-containing polymer covers the polishing-completed object to be polished and the foreign materials, the coating is performed in a larger area. Accordingly, it is particularly easy for foreign materials to form micelles, and thus the effect of removing foreign materials by dissolving and dispersing the micelles is improved. Further, it is presumed that the number of sulfonic acid (salt) groups increases, thereby more strongly expressing the electrostatic adsorption or repulsion effect. From the same viewpoint, the content of the sulfonic acid group-containing polymer is preferably 0.03% by mass or more, more preferably 0.05% by mass or more, with respect to the total mass of the composition for surface treatment. In addition, the content of the sulfonic acid group-containing polymer is preferably 5% by mass or less with respect to the total mass of the composition for surface treatment. When the content of the sulfonic acid group-containing polymer is 5% by mass or less, the effect of removing foreign materials is further enhanced. This is presumably because of better removability of the sulfonic acid group-containing polymer after the cleaning process. From the same viewpoint, the content of the sulfonic acid group-containing polymer is more preferably 3% by mass or less, more preferably 1% by mass or less, particularly preferably 0.1% by mass or less, and the most preferably less than 0.1% by mass, with respect to the total mass of the composition for surface treatment.

In addition, the composition for surface treatment according to an embodiment of the present invention may contain not only the sulfonic acid group-containing polymer but also other polymer compounds. Here, the "polymer compound" refers to a compound having a weight average molecular weight of 1,000 or more. In addition, as the weight average molecular weight, a value measured by the method described in Examples is adopted.

Here, the content of the sulfonic acid group-containing polymer is preferably more than 80% by mass (upper limit is 100% by mass), with respect to the total mass of the polymer compound included in the composition for surface treatment. If the content of the sulfonic acid group-containing polymer is more than 80% by mass with respect to the total mass of the polymer compound included in the composition for surface treatment, the effect of removing the foreign materials is further improved. The reason is because the amount of the polymer compound other than the sulfonic acid group-containing polymer, which can cause the foreign materials after the cleaning process, is reduced. Further, it is presumed that when the sulfonic acid group-containing polymer covers the polishing-completed object to be polished and the foreign materials, the polymer compound other than the sulfonic acid group-containing polymer inhibits the covering from being disturbed. From the same viewpoint, the content of the sulfonic acid group-containing polymer is more preferably more than 95% by mass, with respect to the total mass of the polymer compound included in the composition for surface treatment. In this case, the effect of removing the foreign materials is remarkably improved.

Further, the content of the sulfonic acid group-containing polymer is particularly preferably 100% by mass, with respect to the total mass of the polymer compound included in the composition for surface treatment. That is, the polymer compound included in the composition for surface treatment is particularly preferably composed of only the sulfonic acid group-containing polymer.

Further, examples of the "other polymer compound" included in the composition for surface treatment according to an embodiment of the present invention may include polymer compounds used as other additives described below.

[Acid]

It is preferable that the composition for surface treatment according to an embodiment of the present invention further includes an acid. In addition, in the present specification, the sulfonic acid group-containing polymer is regarded as being different from the acid as an additive used herein. The acid is added mainly for the purpose of adjusting the pH of the composition for surface treatment. As described above, by setting the pH of the composition for surface treatment to 6 or less (acidic), dissolution of tungsten, and the like, can be inhibited. Further, it is presumed that the acid serves to positively charge the surface of the corresponding polishing-completed object to be polished and the surface of the foreign materials when the polishing-completed object to be polished includes silicon nitride, silicon oxide or polysilicon. Therefore, by adding an acid, the electrostatic repulsion effect is further promoted, and the effect of removing the foreign materials by the composition for surface treatment is further improved.

As the acid, either an inorganic acid or an organic acid may be used. The inorganic acid is not particularly limited, and examples thereof may include sulfuric acid, nitric acid, boric acid, carbonic acid, hypophosphorous acid, phosphorous acid, phosphoric acid, and the like. Examples of the organic acid may include, but are not particularly limited to, formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, carboxylic acids such as pimelic acid, maleic acid, phthalic acid, malic acid, tartaric acid, citric acid, and lactic acid, and the like, methanesulfonic acid, ethanesulfonic acid, and isethionic acid, and the like.

Among them, from the viewpoint of increasing the removability of the foreign materials by improving the effect of positively charging the surface of the polishing-completed object to be polished and the surface of the foreign materials, the acid is more preferably maleic acid or nitric acid, and further preferably maleic acid.

In addition, these acids may be used alone or in combination of two or more kinds thereof.

The content of the acid is preferably 0.01% by mass or more with respect to the total mass of the composition for surface treatment. When the content of the acid is 0.01% by mass or more, the effect of removing foreign materials is further improved. This is presumably because of better effect of positively charging the surface of the polishing-completed object to be polished and the surface of the foreign materials. From the same viewpoint, the content of the acid is preferably 0.02% by mass or more, and more preferably 0.03% by mass or more, with respect to the total mass of the composition for surface treatment. In addition, the content of the acid is preferably 5% by mass or less, with respect to the total mass of the composition for surface treatment. When the content of the acid is 5% by mass or less, it is preferable from the viewpoint of cost reduction. From the same viewpoint, the content of the acid is preferably 3% by mass or less, and more preferably 1% by mass or less, with respect to the total mass of the composition for surface treatment.

[Other Additives]

In the composition for surface treatment according to an embodiment of the present invention, other additives may be contained at an arbitrary ratio, if necessary, within the range in which the effects of the present invention are not impaired. However, components other than essential components of the composition for surface treatment according to an embodiment of the present invention may cause foreign materials, and thus it is preferable that the components other than essential components are not added as much as possible. Thus, an addition amount of the components other than essential components is preferably as small as possible, and more preferably, the components other than the essential components are not included. Examples of the other additives may include abrasive grains, alkali, preservative, dissolved gas, reducing agent, oxidizing agent and alkanolamines, and the like. Among them, it is preferable that the composition for surface treatment substantially does not contain the abrasive grains in order to further improve the effect of removing the foreign materials. Here, "substantially does not contain the abrasive grains" refers to a case where the content of the abrasive grains with respect to the total surface treating composition is 0.01% by mass or less.

[Effect of Inhibiting Dissolution of Tungsten Layer]

The composition for surface treatment according to an embodiment of the present invention is preferable as the effect of inhibiting the dissolution of the tungsten layer of the polishing-completed object to be polished is higher. Further, the composition for surface treatment according to an embodiment of the present invention is preferable as the effect of inhibiting the increase in surface roughness of the polishing-completed object to be polished is higher.

Regarding the effect of inhibiting the dissolution of the tungsten layer, it is preferable that when the surface treatment of the polishing-completed object to be polished is performed using the composition for surface treatment, an etching rate of the tungsten layer is lower. Specifically, when the surface treatment of the polishing-completed object to be polished is performed using the composition for surface treatment, a dissolution film thickness per 30 minutes is preferably 50 Å or less, more preferably 45 Å or less, and particularly preferably 40 Å or less. Meanwhile, since it is preferable as the etching rate is lower, the lower limit is not particularly limited, but substantially, a dissolved film thickness per 30 minutes is 0.1 Å.

Further, regarding the effect of inhibiting an increase in the surface roughness of the tungsten layer, it is preferable that after the surface treatment of the polishing-completed object to be polished is performed using the composition for surface treatment, an average surface roughness (Ra) of the polishing-completed object to be polished is smaller. Specifically, the average surface roughness after the surface treatment of the polishing-completed object to be polished is performed using the composition for surface treatment is preferably 12.5 Å or less, more preferably 10 Å or less, and particularly preferably 5 Å or less. Meanwhile, since it is preferable as the average surface roughness is smaller, the lower limit is not particularly limited, but is substantially 0.1 Å.

In addition, values of the etching rate and the average surface roughness are measured by methods described in Examples after the surface treatment is performed by the methods described in Examples.

[Effect of Removing Foreign Material]

The composition for surface treatment according to an embodiment of the present invention is preferable as the effect of removing the foreign materials on the polishing-completed object to be polished is higher. That is, it is preferable that the number of foreign materials remaining on the surface is smaller when the surface treatment of the polishing-completed object to be polished is performed using the composition for surface treatment. Specifically, when the polishing-completed object to be polished is subjected to surface treatment using the composition for surface treatment, the number of foreign materials is preferably 6,000 or less, more preferably 3,000 or less, further preferably 2,000 or less, and particularly preferably 1,500 or less. Meanwhile, since it is preferable as the number of foreign materials is smaller, the lower limit is not particularly limited, but is substantially 100.

In addition, the number of foreign materials is a value measured by methods described in Examples after the surface treatment is performed by methods described in Examples.

<Preparation Method of Composition for Surface Treatment>

A preparation method of the composition for surface treatment is not particularly limited. For example, the composition for surface treatment may be prepared by mixing a phosphonic acid compound containing two or more nitrogen atoms with water. That is, according to another embodiment of the present invention, there is also provided a preparation method of a composition for surface treatment, including mixing a phosphonic acid compound containing two or more nitrogen atoms with water. The kind, added amount, and the like, of the phosphonic acid compound are the same as described above. In addition, in the preparation method of a composition for surface treatment according to an embodiment of the present invention, a polymer compound having a sulfonic acid (salt) group, an acid, other additives, and a dispersing medium other than water, and the like, may be further mixed, if necessary. The kind, added amount, and the like, of the above-described components are the same as described above.

The order of addition and the method of addition of the respective components are not particularly limited. The respective materials may be added either collectively or separately, stepwise or continuously. Further, the mixing method is not particularly limited, and a known method can be used. Preferably, the preparation method of a composition for surface treatment includes sequentially adding a phosphonic acid compound containing two or more nitrogen atoms, if necessary, adding a polymer compound having a sulfonic acid (salt) group or acid, and stirring the mixture in water. In addition, the preparation method of a composition for surface treatment may further include measuring and adjusting the pH of the composition for surface treatment so that the pH is 6 or less.

<Polishing-Completed Object to be Polished>

In the present invention, the polishing-completed object to be polished (which may be referred to as an "object to be cleaned" in some cases in the present specification) has a tungsten-containing layer. Here, "the polishing-completed object to be polished has a tungsten-containing layer" may be any embodiment as long as a surface to be polished contains tungsten. Therefore, the polishing-completed object to be polished may be a substrate composed of tungsten, or a substrate having a tungsten-containing layer or a layer composed of tungsten (e.g., a substrate on which a tungsten-containing layer or a layer composed of tungsten is disposed on a substrate made of polymer or another metal). Preferably, the polishing-completed object to be polished is a polished object to be polished (e.g., a substrate) having the layer composed of tungsten. That is, it is preferable that the composition for surface treatment according to an embodiment of the present invention is used for surface treatment (cleaning, and the like) of the polishing-completed object to be polished having the layer composed of tungsten.

In addition, in the present specification, the polishing-completed object to be polished means an object to be polished after being polished in the polishing process. The polishing process is not particularly limited, but preferably a CMP process.

The composition for surface treatment according to an embodiment of the present invention can effectively reduce the foreign materials remaining on the surface of the polishing-completed object to be polished including silicon nitride, silicon oxide, or polysilicon together with the tungsten-containing layer. Examples of the polishing-completed object to be polished including silicon oxide may include polishing-completed objects to be polished having a TEOS type silicon oxide film formed by using tetraethyl orthosilicate as a precursor (hereinafter also simply referred to as "TEOS"), an HDP film, a USG film, a PSG film, a BPSG film, an RTO film, and the like.

The polishing-completed object to be polished is preferably a polishing-completed semiconductor substrate, and more preferably a semiconductor substrate after CMP. Here, the roughness of the foreign material or the surface may cause deterioration of performance of the semiconductor device. Therefore, when the polishing-completed object to be polished is a polishing-completed semiconductor substrate, it is required to reduce the foreign materials or the roughness of the surface as much as possible in the cleaning process of the semiconductor substrate. The composition for surface treatment according to an embodiment of the present invention has a sufficient effect of removing the foreign materials, which can be preferably used for surface treatment (cleaning, or the like) of the polishing-completed semiconductor substrate.

Specific examples of the polishing-completed object to be polished may include a polishing-completed semiconductor substrate having a structure in which a silicon nitride film or a silicon oxide film is formed on tungsten, a polishing-completed semiconductor substrate having a structure in which all of a tungsten portion, a silicon nitride film, and a silicon oxide film are exposed, and the like.

Here, from the viewpoint of the effect of the present invention, the composition for surface treatment according to an embodiment of the present invention is preferably used for surface treatment of the polishing-completed object to be polished including a tungsten-containing layer, silicon nitride, silicon oxide, or polysilicon. The polishing-completed object to be polished including silicon nitride, silicon oxide, or polysilicon is required to strictly remove the foreign materials in manufacturing a semiconductor device, but the composition for surface treatment according to an embodiment of the present invention has a sufficient ability to remove the foreign materials, which is sufficiently adaptable to this request.

<Surface Treatment Method>

Another embodiment of the present invention is a surface treatment method including surface-treating a polishing-completed object to be polished having a tungsten-containing layer using the composition for surface treatment. Still another embodiment of the present invention is a surface treatment method including surface-treating a polishing-completed object to be polished including a tungsten-containing layer, silicon nitride, silicon oxide or polysilicon using the composition for surface treatment. In the present specification, the surface treatment method is a method of reducing the foreign materials on the surface of the object to be polished, and is a method of performing cleaning in a broad sense.

According to the surface treatment method according to an embodiment of the present invention, residual foreign materials can be sufficiently removed while inhibiting the dissolution of the tungsten-containing layer. That is, according to another embodiment of the present invention, there is provided a method for reducing the foreign materials on the surface of the polishing-completed objected to be polished, which includes surface-treating the polishing-completed object to be polished having the tungsten-containing layer using the composition for surface treatment.

The surface treatment method according to an embodiment of the present invention is performed by a method of bringing the composition for surface treatment into direct contact with the polishing-completed object to be polished.

Examples of the surface treatment method may mainly include (I) a method by rinse polishing treatment, (II) a method by cleaning treatment, and the like. That is, the surface treatment according to an embodiment of the present invention is preferably performed by rinse polishing or cleaning. The rinse polishing treatment and the cleaning treatment are performed to remove foreign materials (particles, metal contamination, organic residue, pad debris, and the like) on the surface of the polishing-completed object to be polished, thereby obtaining a clean surface. The above (I) and (II) are described below.

(I) Rinse Polishing Treatment

The composition for surface treatment according to an embodiment of the present invention is preferably used in a rinse polishing treatment. The rinse polishing treatment is performed on a polishing table (platen) to which the polishing pad is attached, for the purpose of removing the foreign materials on the surface of the object to be polished, after final polishing (finish polishing) is performed on the object to be polished. At this time, the rinse polishing treatment is performed by bringing the composition for surface treatment according to the present invention into direct contact with the polishing-completed object to be polished. As a result, the foreign materials on the surface of the polishing-completed object to be polished are removed by frictional force (physical action) by the polishing pad and chemical action by the composition for surface treatment. Among the foreign materials, particles or organic residues, in particular, are easily removed by physical action. Therefore, in the rinse polishing treatment, the particles or the organic residues can be effectively removed by using friction with the polishing pad on the polishing table (platen).

Specifically, the rinse polishing treatment may be performed by placing the surface of the polishing-completed object to be polished after the polishing process on a polishing table (platen) of a polishing apparatus, and bringing the polishing pad into contact with the polishing-completed semiconductor substrate, thus relatively sliding the polishing-completed object to be polished and the polishing pad while supplying the composition for surface treatment (rinse polishing composition) to the contact portion.

The rinse polishing treatment can be performed using either a single side polishing apparatus or a double side polishing apparatus. In addition, the polishing apparatus preferably includes not only a discharge nozzle of the polishing composition but also a discharge nozzle for the rinse polishing composition. The operation conditions for the rinse polishing treatment of the polishing apparatus are not particularly limited and may be appropriately set by those skilled in the art.

(II) Cleaning Treatment

The composition for surface treatment according to the present invention is preferably used in cleaning treatment. The cleaning treatment is performed for the purpose of removing the foreign materials on the surface of the object to be polished after final polishing (finish polishing) is performed or after the rinse polishing treatment is performed on the object to be polished. Then, the cleaning treatment and the rinse polishing treatment are classified according to the place where these treatments are performed, and the cleaning treatment is surface treatment performed after the polishing-completed object to be polished is detached from the polishing table (platen). Even in the cleaning treatment, the composition for surface treatment according to the present invention can be brought into direct contact with the polishing-completed object to be polished, thereby removing the foreign materials on the surface of the corresponding object.

Examples of a method of performing the cleaning treatment may include (i) a method of bringing a cleaning brush into contact with a single side or double sides of a polishing-completed object to be polished while holding the polishing-completed object to be polished, supplying a composition for surface treatment to the contact portion, and rubbing the surface of an object to be cleaned with the cleaning brush, (ii) a method (dipping method) of immersing the polishing-completed object to be polished in the composition for surface treatment, performing ultrasonic treatment or stirring, and the like. In this method, the foreign materials on the surface of the object to be polished are removed by frictional force by the cleaning brush, mechanical force generated by ultrasonic treatment or stirring, and chemical action by the composition for surface treatment.

As the method of bringing the composition for surface treatment (cleaning composition) into contact with the polishing-completed object to be polished, the above method (i) is not particularly limited, but may include a spin type in which the polishing-completed object to be polished is rotated at a high speed while flowing the composition for surface treatment on the polishing-completed object to be polished from a nozzle, and a spray type in which the composition for surface treatment is sprayed to clean the polishing-completed object to be polished, and the like.

From the viewpoint of more efficient removal of contamination in a short time, the cleaning treatment is preferably performed by adopting the spin type or the spray type, and more preferably the spin type.

Examples of the apparatus for performing this cleaning treatment may include a batch type cleaning apparatus in which a plurality of polishing-completed objects to be polished accommodated in a cassette are simultaneously surface-treated, a single-wafer type cleaning apparatus in which one polishing-completed object to be polished is mounted on a holder and subjected to a surface treatment, and the like. Among them, a method using the single-wafer type cleaning apparatus is preferable from the viewpoint of shortening the cleaning time, and the like.

In addition, examples of the apparatus for performing the cleaning treatment may include a polishing apparatus provided with cleaning equipment which performs rubbing the corresponding object with a cleaning brush after detaching the polishing-completed object to be polished from the polishing table (platen). By using the polishing apparatus, it is possible to more efficiently perform the cleaning treatment of the polishing-completed object to be polished.

As the polishing apparatus, it is possible to use a general polishing apparatus having a holder for holding the polishing-completed object to be polished, a motor capable of changing the number of revolutions, a cleaning brush, and the like. As a polishing apparatus, anyone of a single side polishing apparatus or a double side polishing apparatus may be used. In addition, when the rinse polishing process is performed after the CMP process, it is more efficient and preferable to perform the cleaning treatment using the same apparatus as the polishing apparatus used in the rinse polishing process.

The cleaning brush is not particularly limited, and is preferably a resin brush. A material of the resin brush is not particularly limited, but for example, polyvinyl alcohol (PVA) is preferable. In addition, it is particularly preferable to use a PVA sponge as the cleaning brush.

The cleaning conditions are also not particularly limited, and may be appropriately set according to the kind of the object to be cleaned, and the kind and amount of the organic residues to be removed. For example, the number of revolutions of the cleaning brush is preferably 10 rpm or more and 200 rpm or less. The number of revolutions of the object to be cleaned is preferably 10 rpm or more and 100 rpm or less. A pressure (polishing pressure) applied to the object to be cleaned is preferably 0.5 psi or more and 10 psi or less. A method for supplying the composition for surface treatment to the polishing pad is not particularly limited. For example, a method for continuously supplying (flowing) the composition for surface treatment by a pump or the like may be adopted. A supply amount thereof is not limited, but it is preferable that the cleaning brush and the surface of the object to be cleaned is always covered with the composition for surface treatment, and the supply amount is preferably 10 mL/min or more and 5,000 mL/min or less. The cleaning time is not particularly limited, but the process using the composition for surface treatment according to an embodiment of the present invention is preferably performed from 5 seconds or more and 180 seconds or less. Within the above-described range, the foreign materials can be removed more effectively.

The temperature of the composition for surface treatment at the time of cleaning is not particularly limited and may be generally room temperature, and the composition for surface treatment may be heated to about 40° C. or more and about 70° C. or less within a range in which performance is not impaired.

In the method (ii), conditions of the cleaning method by immersion are not particularly limited, and a known method may be used therefor.

The cleaning with water may be performed before, after, or both before and after the cleaning treatment by the methods (i) and (ii).

Further, it is preferable to dry the object to be polished (object to be cleaned) after cleaning by shaking off water droplets adhering to the surface by a spin dryer or the like. Further, the surface of the object to be cleaned may be dried by air blow drying.

<Manufacturing Method of Semiconductor Substrate>

The surface treatment method according to an embodiment of the present invention is preferably applicable when the polishing-completed object to be polished is a polishing-completed semiconductor substrate having a tungsten-containing layer. That is, according to another embodiment of the present invention, there is provided a manufacturing method of a semiconductor substrate including surface-treating the polishing-completed object to be polished, i.e., the polishing-completed semiconductor substrate having a tungsten-containing layer using the composition for surface treatment.

The details of the semiconductor substrate to which the manufacturing method is applied are as described for the polishing-completed object to be polished which is surface-treated with the above-described composition for surface treatment.

In addition, the manufacturing method of a semiconductor substrate is not particularly limited as long as the manufacturing method includes a process (surface treatment process) of surface-treating the surface of the polishing-completed semiconductor substrate having a tungsten layer using the composition for surface treatment according to an embodiment of the present invention. Examples of the manufacturing method may include a method including a polishing process and a cleaning process for forming the polishing-completed semiconductor substrate having a tungsten layer. In addition, as another example, a method including not only the polishing process and the cleaning process, but also a rinse polishing process between the polishing process and the cleaning process, may be included. Hereinafter, each of these processes is described.

[Polishing Process]

A polishing process which may be included in the manufacturing method of a semiconductor substrate is a process of polishing a semiconductor substrate to form a polishing-completed semiconductor substrate.

The polishing process is not particularly limited as long as it is a process of polishing a semiconductor substrate, but is preferably a chemical mechanical polishing (CMP) process. Further, the polishing process may be a polishing process composed of a single process or a polishing process composed of a plurality of processes. Examples of the polishing process composed of a plurality of processes may include a process in which a finish polishing process is performed after a preliminary polishing process (rough polishing process), a process in which after a primary polishing process, a secondary polishing process is performed once or twice or more, followed by a finish polishing process, and the like. The surface treatment process using the composition for surface treatment according to the present invention is preferably performed after the above finish polishing process.

As the polishing composition, known polishing compositions may be appropriately used depending on characteristics of the semiconductor substrate. The polishing composition is not particularly limited, and for example, may be preferably a polishing composition including abrasive grains, an acid salt, a dispersing medium, and an acid, and the like. Specific examples of the polishing composition may include a polishing composition including sulfonic acid-functionalized colloidal silica, ammonium sulfate, water, and maleic acid, and the like.

As the polishing apparatus, a general polishing apparatus in which a holder for holding an object to be polished or a motor capable of changing the number of revolutions, or the like, is mounted, and in which a polishing table capable of attaching a polishing pad (polishing cloth) is provided, may be used. As a polishing apparatus, any one of a single side polishing apparatus or a double side polishing apparatus may be used.

As the polishing pad, a general nonwoven fabric, polyurethane, and a porous fluororesin, and the like, can be used without particular limitation. It is preferable that the polishing pad is subjected to a groove process in which a polishing solution is gathered.

There is no particular limitation on polishing conditions, for example, it is preferable that the number of rotations of the polishing table, and the number of rotations of the head (carrier) are preferably 10 rpm or more and 100 rpm or less. Further, the pressure (polishing pressure) applied to the object to be polished is preferably 0.5 psi or more and 10 psi or less. A method for supplying the polishing composition to the polishing pad is not particularly limited. For example, a method for continuously supplying (flowing) the polishing composition by a pump, or the like, may be adopted. A supply amount thereof is not limited, but it is preferable that the surface of the polishing pad is always covered with the polishing composition, and the supply amount is preferably 10 mL/min or more and 5,000 mL/min or less. The polishing time is not particularly limited, but a process using the polishing composition is preferably 5 seconds or more and 180 seconds or less.

[Surface Treatment Process]

The surface treatment process refers to a process of reducing foreign materials on the surface of the polishing-completed object to be polished by using the composition for surface treatment according to the present invention. In the manufacturing method of a semiconductor substrate, the cleaning process as the surface treatment process may be performed after the rinse polishing process, or only the rinse polishing process or only the cleaning process may be performed.

(Rinse Polishing Process)

The rinse polishing process may be provided between the polishing process and the cleaning process in the manufacturing method of the semiconductor substrate. The rinse polishing process is a process of reducing the foreign materials on the surface of a polishing-completed object to be polished (polishing-completed semiconductor substrate) by the surface treatment method (rinse polishing method) according to an embodiment of the present invention.

With respect to the apparatuses such as the polishing apparatus, the polishing pad, and the like, and the polishing conditions, the same apparatus and conditions as the polishing process described above can be applied, except that the surface treating composition according to the present invention is supplied instead of the polishing composition.

Details of the rinse polishing method used in the rinse polishing process are the same as described in the description of the rinse polishing treatment.

(Cleaning Process)

The cleaning process may be provided after the polishing process or may be provided after the rinse polishing process in the manufacturing method of the semiconductor substrate. The cleaning process is a process of reducing the foreign materials on the surface of a polishing-completed object to be polished (polishing-completed semiconductor substrate) by the surface treatment method (cleaning method) according to an embodiment of the present invention.

The details of the cleaning method used in the cleaning process are the same as described in the description of the above cleaning method.

EXAMPLE

The present invention is described in more detail with reference to Examples and Comparative Examples. However, the technical scope of the present invention is not limited to only Examples below. Unless otherwise stated, "%" and "part" mean "% by mass" and "part by mass", respectively.

Preparation of Composition for Surface Treatment

Example 1: Preparation of Composition for Surface Treatment A-1

A composition for surface treatment A-1 was prepared by mixing 0.5 parts by mass of an aqueous solution of maleic acid (0.18 parts by mass of maleic acid) with a concentration of 30% by mass as an organic acid, 0.1 parts by mass of diethylenetriamine penta(methylenephosphonic acid) 7-Na salt (DEQUEST® 2066), with water (deionized water) so that the total amount of the composition was 100 parts by mass. The pH confirmed by a pH meter (Product name: LAQUA® manufactured by HORIBA, Ltd.) was 2 for the composition for surface treatment A-1 (liquid temperature: 25° C.).

Example 2: Preparation of Composition for Surface Treatment A-2

A composition for surface treatment A-2 was prepared by mixing 0.5 parts by mass of an aqueous solution of maleic acid (0.18 parts by mass of maleic acid) with a concentration of 30% by mass as an organic acid, 0.066 parts by mass of sodium polystyrenesulfonate (Product name: POLINAS® PS-1 manufactured by Tosoh Organic Chemical Co., Ltd.; weight average molecular weight of 10,000 to 30,000), and 0.1 parts by mass of ethylenediamine tetra(methylenephosphonic acid) 5-Na salt (DEQUEST® 2046), with water (deionized water) so that the total amount of the composition was 100 parts by mass. The pH confirmed by a pH meter (Product name: LAQUA® manufactured by HORIBA, Ltd.) was 2 for the composition for surface treatment A-2 (liquid temperature: 25° C.).

Comparative Example 1: Preparation of Composition for Surface Treatment C-1

A composition for surface treatment C-1 was prepared by adding 0.1% by mass of polyvinyl alcohol (weight average molecular weight of 10,000), water as a solvent, and adjusting the pH to 3 using acetic acid.

Example 3 and Comparative Examples 2 to 6: Preparation of Composition for Surface Treatments A-3 and C-2 to C-6

Each composition for surface treatment was prepared in the same manner as in Example 2 except that each component was changed to the kind shown in Table 1 below. In addition, "-" in Table indicates that the corresponding component was not used. Further, the pH of each composition for surface treatment is also shown in Table 1 below.

Examples 4 to 8: Preparation of Composition for Surface Treatments A-4 to A-8

Each composition for surface treatment was prepared in the same manner as in Example 2 or 3, except that the added amount of the phosphonic acid compound (inhibitor) was changed to the value shown in Table 2 below. In addition, "-" in Table indicates that the corresponding component was not used. Further, the pH of each composition for surface treatment is also shown in Table 2 below.

<Measurement of Weight Average Molecular Weight>

The weight average molecular weight of each material was determined as the value of weight average molecular weight (polyethylene glycol conversion) measured by gel permeation chromatography (GPC). The weight average molecular weight was measured by the following apparatus and conditions.

GPC apparatus: manufactured by Shimadzu Corporation

Form: Prominence+ELSD detector (ELSD-LTII)

Column: VP-ODS (manufactured by Shimadzu Corporation)

Mobile phase A: MeOH

B: 1% acetic acid aqueous solution

Flow rate: 1 mL/min

Detector: ELSD temp. 40° C., Gain 8, $N_2$GAS 350 kPa

Oven temperature: 40° C.

Injection volume: 40 μl

<Evaluation>

[Evaluation of the Number of Foreign Materials]

<Preparation of Polishing-Completed Object to be Polished (Object to be Cleaned)>

A polished-completed silicon nitride substrate after being polished by the following chemical mechanical polishing (CMP) process was prepared as a polishing-completed object to be polished (also referred to as the object to be cleaned, or the polishing-completed substrate).

<<CMP Process>>

Silicon nitride substrates, which are semiconductor substrates, were polished under the following conditions, respectively, using a polishing composition M (composition; 4% by mass of sulfonic acid-functionalized colloidal silica (manufactured by the method described in "sulfonic acid-functionalized silica through quantitative oxidation of thiol groups", Chem. Commun. 246-247 (2003)), a primary particle size of 30 nm and a secondary particle size of 60 nm), 1% by mass of ammonium sulfate, 0.018% by mass of aqueous solution of maleic acid with a concentration of 30% by mass, solvent: water). Here, as the silicon nitride substrate, a 300 mm wafer was used.

—Polishing Apparatus and Polishing Conditions—

Polishing apparatus: FREX300E manufactured by Ebara Corporation.

Polishing pad: Rigid polyurethane pad IC1010 manufactured by Nitta Haas Incorporated.

Polishing pressure: 2.0 psi (1 psi=6894.76 Pa, hereinafter, the same as above)

The number of rotations of the polishing table: 60 rpm

The number of rotations of head: 60 rpm

Supply of polishing composition: flow

Polishing composition supply amount: 300 mL/min

Polishing time: 60 seconds

<<Cleaning Process>>

After the surface of the wafer was polished by the CMP process, the corresponding wafer was removed from the polishing table (platen). Subsequently, each polished substrate was cleaned by a cleaning method including interleaving the wafer vertically with polyvinyl alcohol (PVA) sponge, which is a cleaning brush, using each of the prepared composition for surface treatments (cleaning compositions) in the same polishing apparatus, and rubbing each polishing-completed substrate under the following conditions while applying a pressure.

—Cleaning Apparatus and Cleaning Conditions—

Apparatus: FREX300E manufactured by Ebara Corporation.

The number of rotations of cleaning brush: 100 rpm

The number of rotations of object to be cleaned (polishing-completed substrate): 50 rpm Flow rate of cleaning liquid: 1,000 mL/min Cleaning time: 60 seconds <<Measurement of the Number of Foreign Materials>>

The number of foreign materials was measured for each of the cleaning-completed substrates after being cleaned by the cleaning process according to the following procedure. The evaluation results are shown in Tables 1 and 2.

The number of foreign materials of 0.09 μm or more after cleaning the polishing-completed silicon nitride substrate under the above-described cleaning conditions was measured by using each of the composition for surface treatments. SP-2 manufactured by KLA-TENCOR Corporation was used for the measurement of the number of foreign materials. The measurement was performed for remaining parts except for parts from the outer peripheral end of a single side of the cleaning-completed substrate to the width of 5 mm. In addition, "-" in Table indicates that the measurement was not performed.

[Measurement of Tungsten Etching Rate]

As an indicator of the effect of inhibiting the dissolution of the tungsten layer, an etching test was performed by the following operation. That is, a tungsten wafer (size: 32 mm×32 mm) was immersed in a sample container at 60° C. for 10 minutes, wherein each sample container included 300 mL of the composition for surface treatment stirred at 300 rpm. After the immersion, the tungsten wafer was cleaned with pure water for 30 seconds and dried by air blowing with an air gun. Thicknesses (film thicknesses) of the tungsten wafer before and after the etching test were measured by a manual sheet resistor (VR-120, manufactured by Hitachi Kokusai Electric Inc.). The etching rate (Å/min) was obtained by dividing a difference in thicknesses (film thicknesses) of the tungsten wafer before and after the etching test into an etching test time according to the following method (calculation method of etching rate). In addition, Table shows the etching rate (Å/30 min) converted per 30 minutes.

(Calculation Method of Etching Rate)

The etching rate (Å/min) was calculated by Equation (1) below.

$$\text{Etching rate (Å/min)} = \frac{[\text{Film thickness (Å) of the object to be cleaned before etching}] - [\text{Film thickness (Å) of the object to be cleaned after etching}]}{\text{Etching time (min)}} \quad \text{[Equation 1]}$$

[Measurement of Surface Roughness (Ra)]

The surface roughness (Ra) of the tungsten wafer after air blow drying, which was obtained by performing the same operation as the "measurement of the tungsen etching rate", was measured using a scanning probe microscope (SPM). In addition, the SPM was NANO-NAVI2, which is a product manufactured by Hitachi High-Technologies Corporation. The cantilever was SI-DF40P2. The measurement of the surface roughness was performed three times at a scanning frequency of 0.86 Hz, X: 512 pt, and Y: 512 pt, and an average value thereof was defined as an average surface roughness (Ra).

TABLE 1

| | Inhibitor (phosphonic acid compound) | | | | | Evaluation | | |
|---|---|---|---|---|---|---|---|---|
| | Kind | The number of nitrogen atoms | M.W. | Acid (part by mass) | Sulfonic acid group-containing polymer (part by mass) | pH | Etching rate [Å/30 min] | Average surface roughness Ra [Å] | The number of foreign materials [number] |
| Example 1 | Diethylenetriamine penta(methylenephosphonic acid) 7-Na salt | 3 | 573 | Maleic acid (0.18) | — | 2 | 22 | 4.02 | 5125 |
| Example 2 | Ethylenediamine tetra(methylenephosphonic acid) 5-Na salt | 2 | 430 | ↑ | Sodium polystyrene sulfonate (0.066) | 2 | 36 | 6.59 | 1455 |
| Example 3 | Diethylenetriamine penta(methylenephosphonic acid) 7-Na salt | 3 | 573 | ↑ | ↑ | 2 | 21 | 4.01 | 1360 |
| Comparative Example 1 | — | — | — | Acetic acid | (Polyvinyl alcohol) | 3 | 57 | 11.26 | 4822 |
| Comparative Example 2 | — | — | — | Maleic acid (0.18) | Sodium polystyrene sulfonate (0.066) | 2 | 95 | 14.05 | 1233 |
| Comparative Example 3 | 1-Hydroxyethylidene-1,1-diphosphonic acid | 0 | 206 | ↑ | ↑ | 2 | 77 | 10.59 | — |
| Comparative Example 4 | Nitrilotris(methylenephosphonic acid) | 1 | 299 | ↑ | ↑ | 2 | 60 | 6.64 | — |
| Comparative Example 5 | Aminotri(methylenephosphonic acid) | 1 | 206 | ↑ | ↑ | 2 | 45 | 10.79 | — |
| Comparative Example 6 | 2-Phosphonobutane-1,2,4-tricarboxylic acid | 0 | 270 | ↑ | ↑ | 2 | 90 | 8.01 | — |

TABLE 2

| | Acid (part by mass) | Sulfonic acid group-containing polymer (part by mass) | Kind of inhibitor (phosphonic acid compound) | Amount of inhibitor (part by mass) | Inhibitor/sulfonic acid group-containing polymer (mass ratio) | Etching rate [Å/30 min] | Average surface roughness Ra [Å] |
|---|---|---|---|---|---|---|---|
| Comparative Example 1 | Acetic acid | (Polyvinyl alcohol) | — | 0 | — | 57 | 11.26 |
| Comparative Example 2 | Maleic acid (0.18) | Sodium polystyrene sulfonate (0.066) | — | 0 | — | 95 | 14.05 |
| Example 2 | ↑ | ↑ | Ethylenediamine tetra(methylenephosphonic acid) 5-Na salt | 0.1 | 1.5 | 36 | 6.59 |
| Example 4 | ↑ | ↑ | ↑ | 0.05 | 0.8 | 38 | 11.25 |
| Example 5 | ↑ | ↑ | ↑ | 0.025 | 0.4 | 43 | 12.14 |
| Example 3 | ↑ | ↑ | Diethylenetriamine penta(methylenephosphonic acid) 7-Na salt | 0.1 | 1.5 | 21 | 4.01 |
| Example 6 | ↑ | ↑ | ↑ | 0.05 | 0.8 | 26 | 9.15 |
| Example 7 | ↑ | ↑ | ↑ | 0.025 | 0.4 | 27 | 9.76 |
| Example 8 | ↑ | ↑ | ↑ | 0.01 | 0.2 | 30 | 10.89 |

From the results shown in Table 1, it was found that when the compound without containing two or more nitrogen atoms was used, even though the compound is a phosphonic acid compound, the etching rate was large, thus resulting in dissolution of the tungsten layer (Comparative Examples 3 to 6). Further, it was found that even when the compound without containing the nitrogen atom but containing the phosphonic acid group and the carboxylic acid group was used, the etching rate was large, thus resulting in dissolution of the tungsten layer (Comparative Example 6). On the other hand, when the phosphonic acid compound containing two or more nitrogen atoms was used, not only the dissolution of the tungsten layer but also suppression of the increase in surface roughness could be confirmed (Examples 1 to 3).

In addition, from the results shown in Table 1, it was found that when the sulfonic acid group-containing polymer as well as the phosphonic acid compound was further included, the effect of removing the foreign materials was remarkably improved (comparison between Example 1 and Examples 2 and 3).

Further, from the results shown in Table 2, it was found that as the content of the phosphonic acid compound was larger, the effect of inhibiting the dissolution of the tungsten layer was higher. Particularly, it was found that when the mass ratio of the phosphonic acid compound to the sulfonic acid group-containing polymer exceeded 1, the above effect was more remarkable, and the increase in surface roughness was also remarkably inhibited (Comparison between Example 2 and Examples 4 and 5 and comparison between Example 3 and Examples 6 to 8).

Further, the present application is based on the Japanese patent application No. 2016-146627 filed on Jul. 26, 2016, and a disclosed content thereof is incorporated herein as a whole by reference.

The invention claimed is:

1. A surface treatment method comprising: surface-treating a polishing-completed object to be polished having a tungsten-containing layer using a composition for surface treatment, wherein the composition for surface treatment comprises:
a phosphonic acid compound containing two or more nitrogen atoms; and
water,
wherein the pH is 6 or less.

2. The surface treatment method according to claim 1, wherein the phosphonic acid compound is a compound represented by Formula (1) below or a salt thereof:

[Chemical Formula 1]

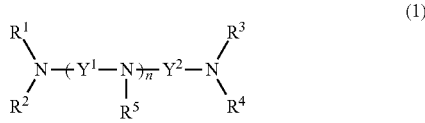

(1)

in Formula (1),
Y$^1$ and Y$^2$ are each independently a linear or branched alkylene group having 1 or more and 5 or less carbon atoms,
n is an integer of 0 or more and 4 or less, and
R$^1$ to R$^5$ each independently represent a hydrogen atom, a substituted or unsubstituted linear or branched alkyl group having 1 or more and 5 or less carbon atoms,
wherein one or more of R$^1$ to R$^5$ is an alkyl group substituted with a phosphonic acid group.

3. The surface treatment method according to claim 2, wherein in Formula (1), at least four of R$^1$ to R$^5$ are alkyl groups substituted with a phosphonic acid group.

4. The surface treatment method according to claim 1, wherein the phosphonic acid compound includes at least one selected from the group consisting of
ethylenediamine tetraethylenephosphonic acid,
ethylenediamine tetramethylenephosphonic acid,
diethylenetriamine pentaethylenephosphonic acid,
diethylenetriamine pentamethylenephosphonic acid,
triethylenetetramine hexaethylenephosphonic acid,
triethylenetetramine hexamethylenephosphonic acid,
propanediamine tetraethylenephosphonic acid, and
propanediamine tetramethylenephosphonic acid, and
ammonium salts, potassium salts, sodium salts, and lithium salts of these acids.

5. The surface treatment method according to claim 1, wherein the pH of the surface treatment composition is 4 or less.

6. The surface treatment method according to claim 1, wherein in the surface treatment composition, abrasive grains are not substantially contained.

7. The surface treatment method according to claim 1, wherein the surface treatment composition further comprises:
a polymer compound having a sulfonic acid (salt) group.

8. The surface treatment method according to claim 7, wherein the polymer compound having the sulfonic acid (salt) group includes at least one selected from the group consisting of sulfonic acid group-containing polyvinyl alcohol, sulfonic acid group-containing polystyrene, sulfonic acid group-containing polyvinyl acetate, sulfonic acid group-containing polyester, and a copolymer of (meth) acrylic group-containing monomer-sulfonic acid group-containing monomer, and sodium salts, potassium salts, calcium salts, magnesium salts, amine salts, and ammonium salts thereof.

9. The surface treatment method according to claim 7, wherein a mass ratio of the phosphonic acid compound to the polymer compound having the sulfonic acid (salt) group exceeds 1.

10. The surface treatment method according to claim 1, wherein the composition for surface treatment further comprises:
an acid.

11. The surface treatment method according to claim 1, wherein the surface treatment is performed by rinse polishing or cleaning.

* * * * *